(12) United States Patent
Hamada

(10) Patent No.: US 10,241,393 B2
(45) Date of Patent: Mar. 26, 2019

(54) PELLICLE

(71) Applicant: Shin-Etsu Chemical Co., Ltd., Tokyo (JP)

(72) Inventor: Yuichi Hamada, Gunma-ken (JP)

(73) Assignee: Shin-Etsu Chemical Co., Ltd., Tokyo (JP)

( * ) Notice: Subject to any disclaimer, the term of this patent is extended or adjusted under 35 U.S.C. 154(b) by 120 days.

(21) Appl. No.: 15/400,060

(22) Filed: Jan. 6, 2017

(65) Prior Publication Data

US 2017/0199452 A1 Jul. 13, 2017

(30) Foreign Application Priority Data

Jan. 7, 2016 (JP) .................. 2016-001629

(51) Int. Cl.
*G03F 1/64* (2012.01)

(52) U.S. Cl.
CPC ..................... *G03F 1/64* (2013.01)

(58) Field of Classification Search
CPC ........................................... G03F 1/64
USPC ............................................. 430/5
See application file for complete search history.

(56) References Cited

U.S. PATENT DOCUMENTS

| 5,422,704 | A | 6/1995 | Sego |
| 9,594,300 | B2 | 3/2017 | Horikoshi |
| 9,645,487 | B2 | 5/2017 | Hamada |
| 2011/0275012 | A1 | 11/2011 | Horikoshi |
| 2015/0085265 | A1 | 3/2015 | Horikoshi |
| 2015/0129103 | A1 | 5/2015 | Hamada |
| 2017/0108771 | A1 | 4/2017 | Horikoshi |

FOREIGN PATENT DOCUMENTS

| EP | 2860583 A2 | 4/2015 |
| EP | 2871521 A2 | 5/2015 |
| EP | 3159739 A2 | 4/2017 |
| JP | 3240261 B2 | 10/2001 |
| JP | 2009-128477 A | 6/2009 |

OTHER PUBLICATIONS

European Search Report dated May 18, 2017 issued in corresponding EP 16204218 application (6 pages).
English Abstract of JP H 1039492 A published Feb. 13, 1998 which corresponds to JP 3240261 B2.
English Abstract of JP 2009-128477 A published Jun. 11, 2009.

*Primary Examiner* — Christopher G Young
(74) *Attorney, Agent, or Firm* — Millen, White, Zelano & Branigan, PC

(57) ABSTRACT

There is provided a pellicle wherein each edge area where the inner wall of the pellicle frame meets the upper end face or the lower end face, respectively, of the pellicle frame consists not only of the conventional single chamfer face but also of additional attempt(s) to make the edge area virtually rounded, such as additional chamfering(s) or rounding, whereby the edge area is devoid of cracking and scars.

8 Claims, 4 Drawing Sheets

PELLICLE

The present non-provisional patent application claims priority, as per Paris Convention, from Japanese Patent Application No. 2016-001629 filed on 2016 Jan. 7, the disclosure of which is hereby incorporated by reference herein in its entirety.

FIELD OF THE INVENTION

The present invention relates to a pellicle, which is used as a dust fender for a photomask for lithography employed in the scenes of manufacturing a semiconductor device, an IC package, a printed circuit board, a liquid crystal display panel, organic electroluminescence display, etc.

BACKGROUND TECHNOLOGY

In manufacturing semiconductor devices such as LSI and Super-LSI or in manufacturing a liquid crystal display board, a pattern is made by irradiating a light to a semiconductor wafer or an original plate for liquid crystal display board; however, if a dust particle adheres to an exposure original plate (or a mask for lithography) used in this pattern creating stage, the dust particle absorbs light or bends it, causing deformation of a transferred pattern, roughened edges or black stains on a base, and leads to problems of damaged dimensions, poor quality, deformed appearance and the like.

For this reason, the above-mentioned lithography works are usually performed in a cleanroom, but even so, it is still difficult to keep the exposure original plate free of dust all the time; therefore, a counter-measure is practiced in which a pellicle having a high transmittance with respect to the light for exposure is bonded to the exposure original plate to shelter a part of the surface thereof. In this way, the dust particle is prevented from directly adhering to that surface of the exposure original plate but is caught on the pellicle membrane, and if, at the time of the lithography, the exposure light is focused on the pattern described on the exposure original plate the dust particle on the pellicle membrane does not partake in the image transferring.

The basic structure of a typical pellicle includes (i) a pellicle frame made of an aluminum alloy with its surface treated by a black colored alumite treatment and/or coated with an acrylic-based electrodeposition resin, (ii) a transparent pellicle membrane made of a material such as cellulose nitrate, cellulose acetate and a fluorine-containing polymer which transmits well such lights that are used in light exposure lithography and tensely adhered to an upper end face of the pellicle frame by means of an adhesive such as an acrylic resin, an epoxy resin and a fluorine-containing resin, and (iii) an agglutinant layer laid on a lower end face of the pellicle frame for bonding the pellicle to the exposure light original plate, the agglutinant layer being made of a polybutene resin, a polyvinyl acetate resin, an acrylic resin, a silicone resin or the like, and (iv) a liner laid over the agglutinant layer for protecting the agglutinant layer (ref. for example, IP Publications 1 and 2).

Also, in IP Publication 3 a pellicle for lithography is disclosed which is characteristic in that the four edges of the pellicle frame where the pellicle membrane-bonding end faces and the exposure original plate-bonding faces of the pellicle frame respectively meet the inner wall and the outer wall of the pellicle frame are chamfered, and that the chamfers on the side of the exposure original plate-bonding end face measure greater than C0.35 but not greater than C0.55.

PRIOR ART PUBLICATIONS

IP Publications

[IP Publication 1] Japanese Patent Application Publication S58(1983)-219023
[IP Publication 2] United States Patent No. 4861402
[IP Publication 3] Japanese Patent Application Publication 2009-251022

SUMMARY OF THE INVENTION

Problems the Invention Seeks to Solve

A pellicle is placed on a mask plate in a manner such that it enclose a pattern area formed on the surface of the mask plate. The pellicle is installed for the purpose of preventing dust particles from reaching the pattern area of the mask plate, and it attains the purpose by isolating the pattern area from the space outside the pellicle so as to stop the dust particle from reaching the pattern area.

In recent years, the LSI design rule is moving toward greater refining of the pattern density on the order of sub-quarter micron, and with this the size of the dust particles to be prevented from contaminating is being minimized. For this reason, necessity has arisen to keep an eye on to say nothing of the inner wall of the pellicle frame but also the edges where the inner wall meets with the upper and the lower end faces as well as the edges of the chamfers which are formed where the inner wall meets with the upper and the lower end faces of the pellicle frame so as to prevent the particle generation.

With respect to a scratch or a protrusion that can be caused at the boundary edges between the inner wall and the upper and the lower end faces and also at the edges of the chamfers formed between the inner wall and the upper and the lower end faces, during machining of metallic pellicle frame, applying of a frame surface coating layer or pellicle manufacturing process, there is a possibility that they are taken as particles at the time of inspection and counted as pseudo foreign matters, so that a more stringent control has become necessary.

In general, the edges of a pellicle frame are liable to be scratched and damaged to have protrusions due to their shape. For this reason, usually chamfers are made to the edges of the pellicle frame where the inner wall and the outer wall respectively meet the upper and the lower end faces; however, the boundary edges created between the chamfer faces on one hand and the upper and the lower faces and the inner and the outer walls on the other, respectively, are also liable to incur protrusions and scratches, although those edges are of obtuse angles.

It is therefore an object of the present invention to propose a pellicle with which it is possible to substantially prevent the creation of scars and protrusion from occurring at the boundary edges between various faces of the pellicle frame.

Means to Solve the Problems

In order to solve the above-stated problems the present inventors did stringent study and as the result it was confirmed that the number of the scratches and the protrusions that look like dust particles and occur at the edge areas where the inner wall of the pellicle frame meets the upper or the lower end face, respectively, can be reduced if the cross section of a pellicle bar cut perpendicularly to the axis of the pellicle bar is such that the profile of the said edge areas describe a virtual curve. In other words, the present invention is characteristic in that the edge areas where the inner wall of the pellicle frame meets the upper or the lower end faces, respectively, are virtually rounded. The meaning of "virtual curve" or "virtually rounded" in this specification means that an edge of the pellicle frame where the inner wall of the pellicle frame meets the upper or the lower end face is chamfered or rounded in addition to the primary chamfering.

In the above pellicle it is preferable if the said edge areas describe a true curve in cross-sectional view.

Also, in the above pellicle it is equally effective if the edge areas where the inner wall of the pellicle frame meets the upper or the lower end faces, respectively, are chamfered to have (primary) chamfer faces and that those edge areas where the inner wall of the pellicle frame meets the said chamfer faces are either rounded or further chamfered (to have secondary chamfer faces).

It is further preferable that if the angles included between the inner wall of the pellicle frame and the secondary chamfer faces as well as the angles included between the primary chamfer faces and the secondary chamfer faces are greater than 135°.

Also, it is possible that if the edges between the inner wall of the pellicle frame and the secondary chamfer faces as well as the edges between the primary chamfer faces and the secondary chamfer faces are completely rounded or further chamfered.

It is preferable that the pellicle frame is coated with an anodic oxidation coating layer or an acrylic-based electrodeposition layer.

Effects of the Invention

The pellicle of the present invention enables a highly accurate dust particle control since during the inspection for pellicle frame appearance and foreign matters, which are conducted after the completion of the pellicle, there is scarce chance that the inspector would erroneously count any non-particle matters such as scratches and protrusions that occur in the vicinities of the upper and the lower peripheries of the inner wall of the pellicle frame, on account of the fact that the number of such matters is substantially reduced due to the new design of the said vicinities.

EXAMPLES TO EMBODY THE INVENTION

Now the invention will be explained with the help of drawings.

Figure 1:
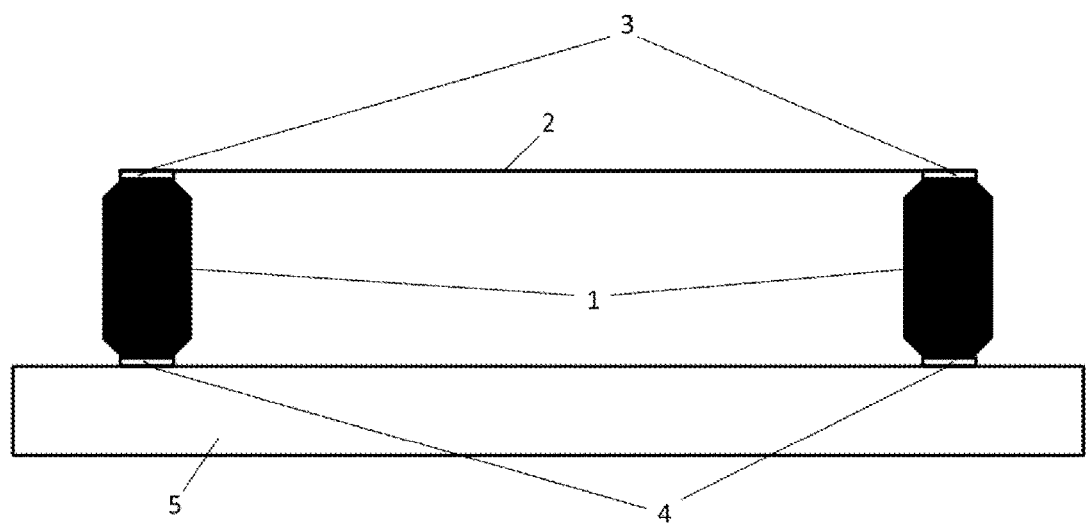
FIG. 1 A schematic cross section showing the structure of a common pellicle.

First the general structure of a pellicle, which applies to the pellicle of the present invention will be explained. FIG. 1 is a schematic cross section showing the structure of a common pellicle. Usually, a pellicle is composed of a pellicle frame 1, a pellicle membrane 2, an adhesive layer 3 to bond the pellicle membrane 2 to the pellicle frame 1, an agglutinant layer 4 to bond the pellicle to a photomask 5, and a liner (not shown) to protect the agglutinant layer 4 especially against damage incurred during transportation and storage. The pellicle of the present invention has the similar structure and therefore a pellicle of the present invention can be created from this pellicle.

The base material for the pellicle frame 1 is often an aluminum alloy with its surface treated by black colored alumite treatment or an aluminum alloy coated with an acrylic-based electrodeposition resin.

Figure 2:
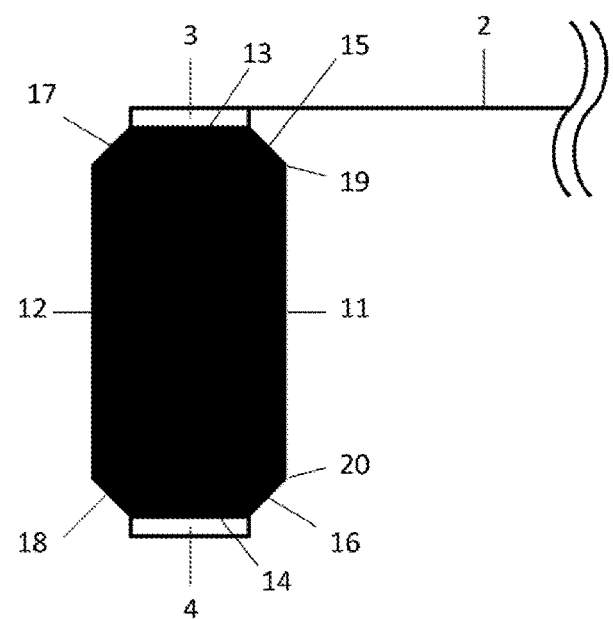
FIG. 2 A magnified schematic cross section showing a part of a conventional pellicle frame wherein the edges at which the inner wall of the pellicle frame meets the upper end face and the lower end face are chamfered to have a primary chamfer face, respectively.

Also, as shown in FIG. 2, which depicts the area of interest in magnified view, the edges of the pellicle frame 1 wherein the inner wall 11 or the outer wall 12 meets the upper face 13 or the lower face 14 are in many cases chamfered. The reason for this is that if the edge is chamfered it is less likely that a flaw occurs at the edge area whereby creation of dust particles is prevented and also the handling operation of the frame becomes more efficient. As shown in FIG. 2, a chamfer face 15 is formed at the edge where the inner wall 11 and the upper end face 13 of the pellicle frame meet each other, a chamfer face 16 is formed at the edge where the inner wall 11 and the lower end face 14 of the pellicle frame meet each other, a chamfer face 17 is formed at the edge where the outer wall 12 and the upper end face 13 of the pellicle frame meet each other, and a chamfer face 18 is formed at the edge where the outer wall 12 and the lower end face 14 of the pellicle frame meet each other. Incidentally, in FIG. 2, the reference numeral 19 designates an edge included between the inner wall 11 of the pellicle frame and the chamfer face 15, which is formed between the inner wall 11 and the upper end face 13, and the reference numeral 20 designates an edge which is formed between the inner wall 11 of the pellicle frame and the chamfer face 16, which is formed between the inner wall 11 of the pellicle frame and the lower end face 14.

Figure 5:
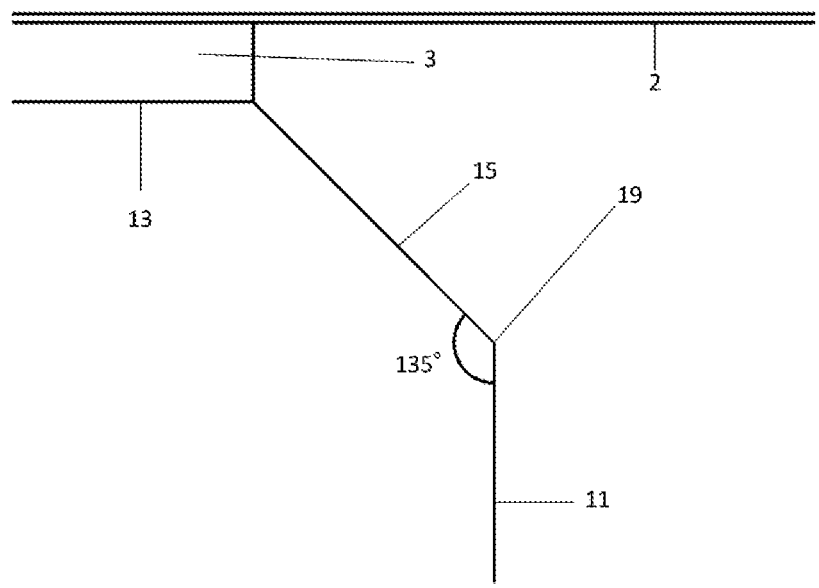
FIG. 5 A schematic cross section of a conventional pellicle frame wherein the edges at which the inner wall of the pellicle frame meets the upper end face and the lower end face are chamfered, and one of those areas where the inner wall and the upper end face meet is shown in magnified view.

Also, FIG. 5 is a schematic cross section of a conventional pellicle, which depicts one of the edge areas formed between the inner wall 11 of the pellicle frame and the upper end face 13 in magnified view. In this drawing, the angle included between the inner wall 11 of the pellicle frame and a chamfer face 15 formed between the inner wall 11 of the pellicle frame and the upper end face 13 is indicated as 135°.

The pellicle membrane 2 is made of a material, such as cellulose nitrate, cellulose acetate and a fluorine-containing polymer, which transmits well such lights that are used in light exposure lithography. In the case of EUV exposure lithography, which is highlighted as the next generation lithography technology, use of silicone crystal membrane as the pellicle membrane is being studied.

As for the adhesive layer 3, an adhesive such as an acrylic resin, an epoxy resin or a fluorine-containing resin that glues the pellicle member 2 to the pellicle frame 1 dependably is used. Also, for the agglutinant layer 4, a polybutene resin, a polyvinyl acetate resin, an acrylic resin, a silicone resin or the like is used.

Although the above brief explanation gave examples of structures and materials to be adopted in the making of a conventional pellicle, they are not limited thereto but it is possible to adopt different designs depending of the requirements. Next, features of the present invention will be explained.

Figure 3:
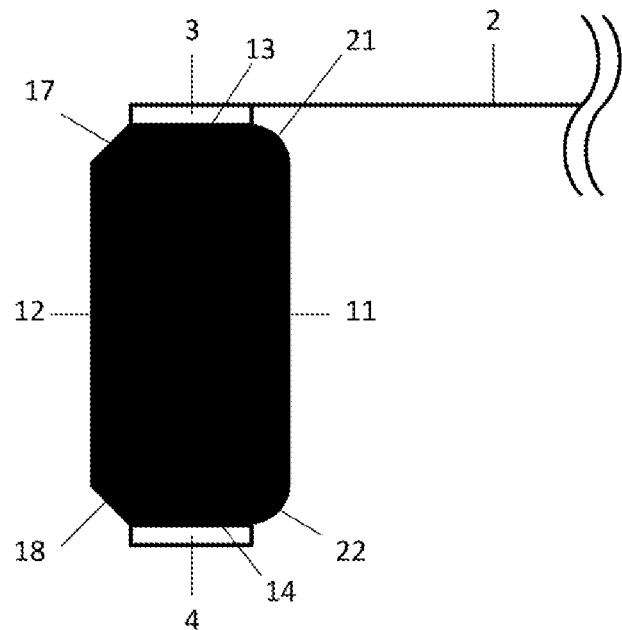
FIG. 3 A magnified schematic cross section showing a part of a pellicle frame of the present invention wherein the edges at which the inner wall of the pellicle frame meets the upper end face and the lower end face are completely rounded.

FIG. 3 is a schematic cross section showing an example of the present invention according to claim 2. As shown in FIG. 3, each edge area formed between the inner wall 11 of the pellicle frame and the upper end face 13 and each edge area formed between the inner wall 11 of the pellicle frame and the lower end face 14 are completely rounded to have a roughly circular profiles 21 and 22, respectively.

For rounding the edges, a commercially available tooling machine can be used and the radius R of the roughly circular part of the profiles 21 and 22 is not limited. Only, an overly large R is not recommended in consideration of the adverse effects on the pellicle frame strength, the application areas of the adhesive and agglutinant, etc.

Figure 6:
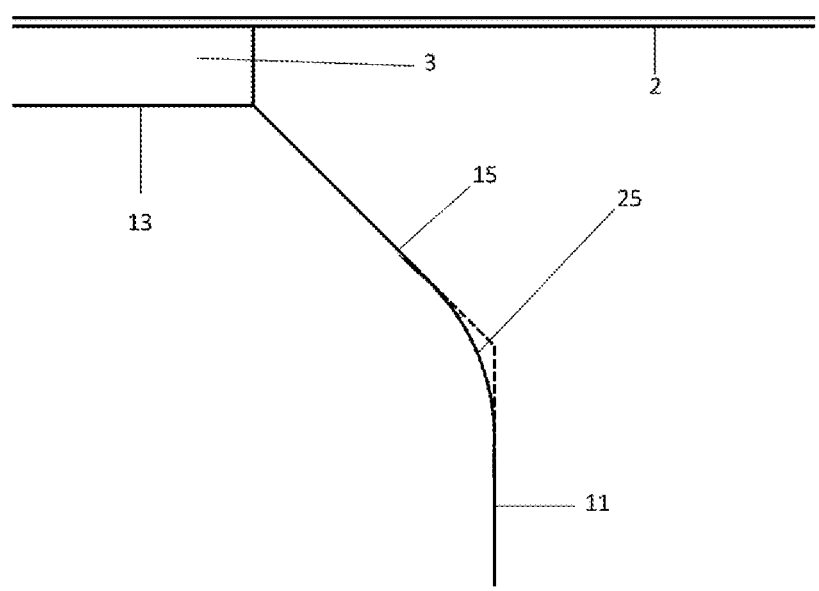
FIG. 6 A schematic cross section of a pellicle frame of the present invention wherein the edges at which the inner wall of the pellicle frame meets the primary chamfer faces are completely rounded, and one of those areas where the inner wall and the upper end face meet is shown in magnified view.

FIG. 6 is a schematic cross section showing an example of the present invention according to claim 3. As shown in FIG. 6, the edge area formed between the inner wall 11 of the pellicle frame and the upper end face 13 is chamfered to have a chamfer face 15, and further the edge formed between the inner wall 11 of the pellicle frame and this chamfer face 15 is completely rounded to have a roughly circular profiles 25. It is possible to have other edges chamfered; for example, the edges formed between the chamfer face 15 and the upper end face and the lower end face of the pellicle frame, respectively, are chamfered to have secondary chamfer faces.

Figure 4:
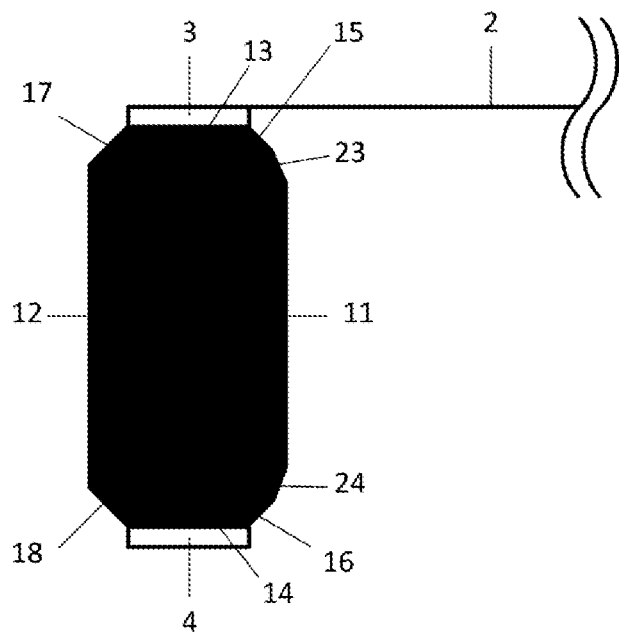
FIG. 4 A magnified schematic cross section showing a part of a pellicle frame of the present invention wherein the edges at which the inner wall of the pellicle frame meets the primary chamfer faces are further chamfered to have a secondary chamfer face, respectively.

FIG. 4 is a schematic cross section showing an example of the present invention according to claim 4. As shown in FIG. 4, the edges formed by the inner wall 11 of the pellicle frame and the upper end face 13 thereof as well as the edges formed by the inner wall 11 of the pellicle frame and the lower end face 14 thereof are chamfered to have (primary) chamfer faces 15 and 16 respectively, and furthermore, the edges formed by the inner wall 11 of the pellicle frame and the chamfer faces 15 and 16 respectively are chamfered to have secondary chamfer faces 23, 24.

Figure 7:
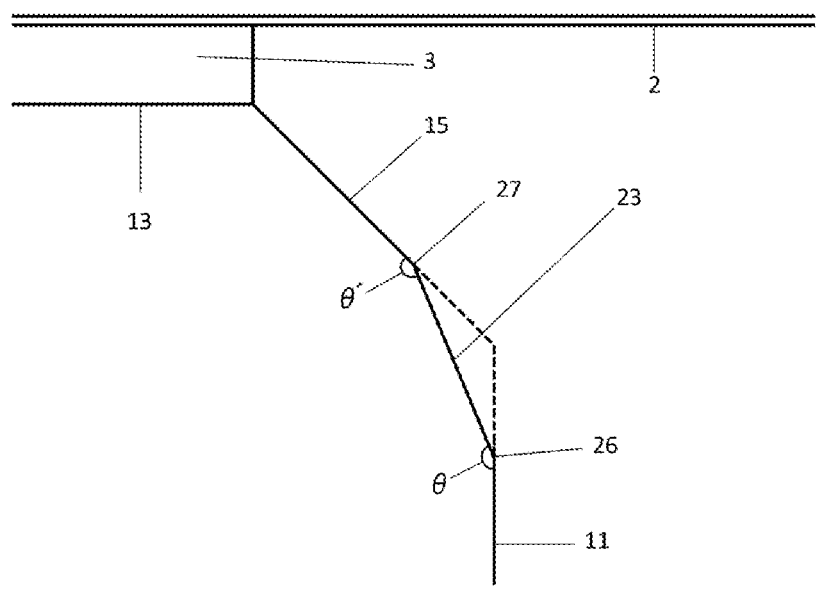
FIG. 7 A schematic cross section of a pellicle frame of the present invention wherein the edges at which the inner wall of the pellicle frame meets the primary chamfer faces are further chamfered to have a secondary chamfer face, respectively, and one of those areas where the inner wall and the upper end face meet is shown in magnified view.

FIG. 7 is a schematic cross section of a pellicle having secondary chamfer faces, and the area in the vicinity of the edge formed between the inner wall and the upper end face is shown in a magnified view. As shown in FIG. 7, in the present invention, the angles of edges 26 and 27 (θ and θ', respectively) are preferably greater than 135°. By making these edge angles greater than 135°, it is possible to minimize the number of scars and protrusions that occur at these edges to a greater extent. Incidentally, the reference numeral 26 in FIG. 7 designates an edge formed by the inner wall 11 of the pellicle frame and the secondary chamfer face 23, which is formed between the inner wall 11 of the pellicle frame and the chamfer face 15 formed between the inner wall 11 of the pellicle frame and the upper end face 13; and the reference numeral 27 designates an edge formed by the secondary chamfer face 23, which is formed between the inner wall 11 of the pellicle frame and the chamfer face 15, and the chamfer face 15, which is formed between the inner wall 11 of the pellicle frame and the upper end face 13 thereof.

It is possible to round or chamfer the edge 26 and/or edge 27, and there is no limit to the number of times the chamfering is worked on the edges that are created after respective chamfering. By conducting a number of chamfering, the effect of preventing the scars and protrusion at the edges is further improved and the extent of chamfering operation should be determined based on operation rationality.

It is preferable that the thus machined pellicle frame is provided with an anodic oxidation coating layer or an acrylic-based electrodeposition layer. By coating the pellicle frame with an anodic oxidation coating layer or an acrylic-based electrodeposition layer, it is possible to reduce the number of occurrences of the scratches and protrusion at the edge areas.

Also by rounding the edge area or increasing the angles of the edges at the chamfered area, it is possible to prevent the anodic oxidation coating layer or the acrylic-based electrodeposition layer from having local irregularity in thickness so that a more uniform layers can be formed.

EXAMPLES

We will now describe the present invention in a concrete manner using examples and comparative examples; however the present invention shall not be construed to be limited by them.

Example 1

A pellicle frame made of aluminum and having an outward dimension of 149 mm by 115 mm by 3.15 mm, with a frame bar thickness of 2 mm, was prepared. The edges formed by the inner wall of this frame and the upper and lower end faces respectively were rounded by a tool in a manner such that the thus rounded edges have a profile consisting of a roughly circular curve having a radius R of 0.5 mm or so (round chamfering). The edges formed by the outer wall and the upper and the lower end faces respectively were chamfered in a manner such that, as viewed in cross section, a right-angled isosceles triangle having shorter sides of 200 μm was removed by machining, which is a commonly adopted chamfering for pellicle frames (hereinafter referred to as "C200 μm chamfer". After the machining a black color alumite layer was deposited on the surface of the frame, and thus a pellicle frame was completed. After conducting a precision-washing upon this pellicle frame, an agglutinant was applied to the inner wall of the pellicle frame, and the mask-bonding agglutinant was applied to the lower end face and the pellicle membrane-bonding adhesive was applied to the upper end face; and then the pellicle membrane was adhered to the upper end face. After this fashion, 100 pellicles were completed. These completed pellicles were inspected for appearance of the inner wall of the pellicle frames, and none of them was observed to reflect a light that would indicate an existence of a scratch or a foreign matter from the boundary area between the pellicle membrane and the pellicle frame or the boundary area between the mask-bonding agglutinant layer and the pellicle frame.

Example 2

A pellicle frame made of aluminum and having an outward dimension of 149 mm by 115 mm by 3.15 mm, with a frame bar thickness of 2 mm, was prepared. The edges formed by the inner wall of this frame and its upper and lower end faces, respectively, as well as those formed by the outer wall of the frame and its upper and lower end faces, respectively, were chamfered to have the conventional C200 µm chamfer. Then the edges formed by the C200 µm chamfer face and the inner wall of the frame were rounded with sandpaper of #600. After the rounding, a black color alumite layer was deposited on the surface of the frame, and thus a pellicle frame was completed. After conducting a precision-washing upon this pellicle frame, an agglutinant was applied to the inner wall of the pellicle frame, and the mask-bonding agglutinant was applied to the lower end face and the pellicle membrane-bonding adhesive was applied to the upper end face; and then the pellicle membrane was adhered to the upper end face. After this fashion, 100 pellicles were completed. These completed pellicles were inspected for appearance of the inner wall of the pellicle frames, and none of them was observed to reflect a light that would indicate an existence of a scratch or a foreign matter from the boundary area between the pellicle membrane and the pellicle frame or the boundary area between the mask-bonding agglutinant layer and the pellicle frame.

Example 3

A pellicle frame made of aluminum and having an outward dimension of 149 mm by 115 mm by 3.15 mm, with a frame bar thickness of 2 mm, was prepared. The edges formed by the inner wall of this frame and its upper and lower end faces, respectively, as well as those formed by the outer wall of the frame and its upper and lower end faces, respectively, were chamfered to have the conventional (primary) chamfer face having a dimension of C200 µm. Then the edges formed by the C200 µm chamfer face and the inner wall of the frame were further chamfered to have a secondary chamfer face having a dimension of C100 µm. The angle included between the inner wall of the pellicle frame and the secondary chamfer face and that between the primary chamfer face and the secondary chamfer face were both 157.5°. After this machining, the surface of the frame was coated with an acrylic-based electrodeposition resin layer, and thus a pellicle frame was completed. After conducting a precision-washing upon this pellicle frame, an agglutinant was applied to the inner wall of the pellicle frame, and the mask-bonding agglutinant was applied to the lower end face and the pellicle membrane-bonding adhesive was applied to the upper end face; and then the pellicle membrane was adhered to the upper end face. After this fashion, 100 pellicles were completed. These completed pellicles were inspected for appearance of the inner wall of the pellicle frames, and none of them was observed to reflect a light that would indicate an existence of a scratch or a foreign matter from the boundary area between the pellicle membrane and the pellicle frame or the boundary area between the mask-bonding agglutinant layer and the pellicle frame.

Example 4

A pellicle frame made of aluminum and having an outward dimension of 149 mm by 115 mm by 3.15 mm, with a frame bar thickness of 2 mm, was prepared. The edges formed by the inner wall of this frame and its upper and lower end faces, respectively, as well as those formed by the outer wall of the frame and its upper and lower end faces, respectively, were chamfered to have the conventional (primary) chamfer face having a dimension of C200 µm. Then the edges formed by the C200 µm chamfer face and the inner wall of the frame were further chamfered to have a secondary chamfer face having a dimension of C100 µm. Then, the edge formed by the inner wall of the pellicle frame and the secondary chamfer face as well as the edge formed by the primary chamfer face and the secondary chamfer face were rounded with sandpaper of #600. After this rounding, the surface of the frame was coated with an acrylic-based electrodeposition resin layer, and thus a pellicle frame was completed. After conducting a precision-washing upon this pellicle frame, an agglutinant was applied to the inner wall of the pellicle frame, and the mask-bonding agglutinant was applied to the lower end face and the pellicle membrane-bonding adhesive was applied to the upper end face; and then the pellicle membrane was adhered to the upper end face. After this fashion, 100 pellicles were completed. These completed pellicles were inspected for appearance of the inner wall of the pellicle frames, and none of them was observed to reflect a light that would indicate an existence of a scratch or a foreign matter from the boundary area between the pellicle membrane and the pellicle frame or the boundary area between the mask-bonding agglutinant layer and the pellicle frame.

Comparative Example 1

A pellicle frame made of aluminum and having an outward dimension of 149 mm by 115 mm by 3.15 mm, with a frame bar thickness of 2 mm, was prepared. The edges formed by the inner wall of this frame and its upper and lower end faces, respectively, as well as those formed by the outer wall of the frame and its upper and lower end faces, respectively, were chamfered to have the conventional chamfer face having a dimension of C200 µm. After this chamfering, a black color alumite layer was deposited on the surface of the frame, and thus a pellicle frame was completed. After conducting a precision-washing upon this pellicle frame, an agglutinant was applied to the inner wall of the pellicle frame, and the mask-bonding agglutinant was applied to the lower end face and the pellicle membrane-bonding adhesive was applied to the upper end face; and then the pellicle membrane was adhered to the upper end face. After this fashion, 100 pellicles were completed. These completed pellicles were inspected for appearance of the inner wall of the pellicle frames, and twelve of them were observed to reflect a light that would indicate an existence of a scratch or a foreign matter from the boundary area between the pellicle membrane and the pellicle frame or the boundary area between the mask-bonding agglutinant layer and the pellicle frame.

Comparative Example 2

A pellicle frame made of aluminum and having an outward dimension of 149 mm by 115 mm by 3.15 mm, with a frame bar thickness of 2 mm, was prepared. The edges formed by the inner wall of this frame and its upper and lower end faces, respectively, as well as those formed by the outer wall of the frame and its upper and lower end faces, respectively, were chamfered to have the conventional chamfer face having a dimension of C200 µm. After this chamfering, the surface of the frame was coated with an acrylic-based electrodeposition resin layer, and thus a pellicle frame was completed. After conducting a precision-washing upon this pellicle frame, an agglutinant was applied to the inner wall of the pellicle frame, and the mask-bonding agglutinant was applied to the lower end face and the pellicle membrane-bonding adhesive was applied to the upper end face; and then the pellicle membrane was adhered to the upper end face. After this fashion, 100 pellicles were completed.

These completed pellicles were inspected for appearance of the inner wall of the pellicle frames, and nine of them were observed to reflect a light that would indicate an existence of a scratch or a foreign matter from the boundary area between the pellicle membrane and the pellicle frame or the boundary area between the mask-bonding agglutinant layer and the pellicle frame.

From the above results of the appearance inspection of the inner wall of the pellicle frames, since none of the pellicles of the present invention was observed to possess a foreign matter or a scar in the boundary area between the pellicle membrane and the pellicle frame and the boundary area between the mask-bonding agglutinant layer and the pellicle frame, it is possible to infer that the number of the scars and protrusions which could be mistaken for foreign particles were also reduced (to zero), and thus it can be concluded that the inspection precision was heightened and a highly stringent and accurate foreign particle control has become possible.

EXPLANATION OF REFERENCE NUMERALS

1: pellicle frame
2: pellicle membrane
3: adhesive layer
4: agglutinant layer
5: photomask
11: inner wall of the pellicle frame
12: outer wall of the pellicle frame
13: upper end face of the pellicle frame
14: lower end face of the pellicle frame
15: a chamfer face formed between the inner wall and the upper end face of the pellicle frame
16: a chamfer face formed between the inner wall and the lower end face of the pellicle frame
17: a chamfer face formed between the outer wall and the upper end face of the pellicle frame
18: a chamfer face formed between the outer wall and the lower end face of the pellicle frame
19: an edge formed by the inner wall and the (primary) chamfer face which is formed between the upper end face and the inner wall of the pellicle frame
20: an edge formed by the inner wall and the (primary) chamfer face which is formed between the lower end face and the inner wall of the pellicle frame
21: a rounded edge formed between the inner wall and the upper end face of the pellicle frame
22: a rounded edge formed between the inner wall and the lower end face of the pellicle frame
23: a secondary chamfer face formed between the inner wall and the primary chamfer face which was primarily formed between the upper end face and the inner wall of the pellicle frame
24: a secondary chamfer face formed between the inner wall and the primary chamfer face which was primarily formed between the lower end face and the inner wall of the pellicle frame
25: a rounded edge formed between the inner wall and the chamfer face which was formed between the inner wall and the upper end face of the pellicle frame
26: an edge formed by the inner wall and a secondary chamfer face which is formed between the inner wall and the primary chamfer face which was primarily formed between the upper end face and the inner wall of the pellicle frame
27: an edge formed by a primary chamfer face primarily formed between the upper end face and the inner wall and a secondary chamfer face secondarily formed between the primary chamfer face and the inner wall

What is claimed is:

1. A pellicle comprising a pellicle frame having an inner wall, an outer wall, an upper end face and a lower end face, and a pellicle membrane, which is adhered to said upper end face of the pellicle frame,
   wherein each edge area where the inner wall meets the upper end face or the lower end face, respectively, describes a virtual curve when viewed in cross section at least one of which comprises a primary chamfer face.

2. A pellicle as claimed in claim 1, wherein said each edge area describes a true curve when viewed in cross section.

3. A pellicle as claimed in claim 1, wherein said each edge area consists of a primary chamfer face, which is primarily formed by chamfering an edge formed by said inner wall and said upper end face or said lower end face, respectively, and a rounded edge, which is formed by rounding an edge formed by said primary chamfer face and the inner wall.

4. A pellicle as claimed in claim 1, wherein said each edge area consists of a primary chamfer face, which is primarily formed by chamfering an edge formed by said inner wall and said upper end face or said lower end face, respectively, and a secondary chamfer face, which is secondarily formed by chamfering an edge formed by said primary chamfer face and the inner wall.

5. A pellicle as claimed in claim 4, wherein an angle included between the inner wall and said secondary chamfer face and an angle included between said primarily chamfer face and said secondary chamfer face are both greater than 135°.

6. A pellicle as claimed in claim 4, wherein an edge formed by the inner wall and the secondary chamfer face and an edge formed by said primary chamfer face and said secondary chamfer face are independently either rounded or chamfered.

7. A pellicle as claimed in claim 1, wherein the pellicle frame is coated with an anodic oxidation coating layer.

8. A pellicle as claimed in claim 1, wherein the pellicle frame is coated with an acrylic-based electrodeposition resin.

* * * * *